US 11,476,381 B2

(12) United States Patent
Park et al.

(10) Patent No.: US 11,476,381 B2
(45) Date of Patent: Oct. 18, 2022

(54) SINGLE PHOTON DETECTOR AND SYSTEM FOR MINIMIZING DARK CURRENT

(71) Applicant: Wooriro Co., Ltd., Gwangju (KR)

(72) Inventors: Chan Yong Park, Gwangju (KR); Soo Hyun Baek, Gwangju (KR); Jung Hyun Kim, Gwangju (KR)

( * ) Notice: Subject to any disclaimer, the term of this patent is extended or adjusted under 35 U.S.C. 154(b) by 0 days.

(21) Appl. No.: 17/488,470

(22) Filed: Sep. 29, 2021

(65) Prior Publication Data
US 2022/0158020 A1    May 19, 2022

(30) Foreign Application Priority Data
Nov. 16, 2020  (KR) .................. 10-2020-0153193

(51) Int. Cl.
  *H01L 31/107*    (2006.01)
  *H01L 31/0224*   (2006.01)
(52) U.S. Cl.
  CPC .... *H01L 31/107* (2013.01); *H01L 31/022408* (2013.01)
(58) Field of Classification Search
  CPC .................. H01L 31/107; H01L 31/108; H01L 31/022408
  See application file for complete search history.

(56) References Cited

U.S. PATENT DOCUMENTS

| | | | |
|---|---|---|---|
| 8,698,268 B2 | 4/2014 | Yagyu et al. | |
| 8,710,547 B2 | 4/2014 | Sim et al. | |
| 2007/0096236 A1* | 5/2007 | Yagyu | H01L 31/107 257/438 |
| 2020/0313022 A1* | 10/2020 | Sim | H01L 31/02327 |
| 2022/0069152 A1* | 3/2022 | Tosi | G01S 7/4863 |

FOREIGN PATENT DOCUMENTS

| KR | 10-2013-0113656 | 10/2013 |
|---|---|---|
| KR | 10-2017-0132467 | 12/2017 |

OTHER PUBLICATIONS

English Specification of 10-2013-0113656.
English Specification of 10-2017-0132467.

* cited by examiner

*Primary Examiner* — Suberr L Chi
(74) *Attorney, Agent, or Firm* — Antonio Ha & U.S. Patent, LLC

(57) ABSTRACT

According to an embodiment, a single photon detector configured to reduce a dark current comprises a buffer layer, a light absorption layer, a grading layer, an electric field control layer, and a window layer sequentially formed on a substrate. An active area may be formed in the window layer. A barrier junction may be formed through the window layer up to at least a portion of the light absorption layer, around the active area.

6 Claims, 5 Drawing Sheets

Photon

SINGLE PHOTON DETECTOR AND SYSTEM FOR MINIMIZING DARK CURRENT

CROSS-REFERENCE TO RELATED APPLICATION(S)

This application is based on and claims priority under 35 U.S.C. 119 to Korean Patent Application No. 10-2020-0153193, filed on Nov. 16, 2020, in the Korean Intellectual Property Office, the disclosure of which is herein incorporated by reference in its entirety.

TECHNICAL FIELD

Embodiments of the disclosure relate to a single photon detector and single photon detection system that minimizes dark current.

DESCRIPTION OF RELATED ART

The description of the Discussion of Related Art section merely provides information that may be relevant to embodiments of the disclosure but should not be appreciated as necessarily constituting the prior art.

With the development of information and communication technology, the importance of single photon detectors capable of detecting a single photon in quantum cryptography communication is increasing.

Single photon detectors are suitable for long-range communication wavelength bands of 1.3 μm to 1.5 μm and are particularly effective in detecting low-intensity optical signals, such as single photons. Single photon detectors mainly adopt an InGaAs/InP-type avalanche photo diode (APD) as a light receiving element.

The APD operates at a voltage higher than the breakdown voltage to detect a single photon, which is called the Geiger mode. In the Geiger mode, a large reverse voltage may be applied to the PN junction of the APD, thereby creating a large electric field in the PN junction. In this case, electron-hole pairs are generated at the PN junction by photons incident on the PN junction. The electron-hole pairs obtain energy from the strong electromagnetic field applied to the PN junction and are in turn accelerated, generating new electron-hole pairs. The cumulative occurrence of this phenomenon is called the avalanche (electron avalanche) phenomenon.

In some cases, a photon may be detected as if it has entered even when it has not. This phenomenon is called dark current. A dark current in the semiconductor PN junction is generated as electrons are rendered to transition from the valence band to the conduction band by thermal energy. The dark current exponentially increases or decreases according to the magnitude of the bandgap energy $$\left[\propto \exp\left(-\frac{E_g}{kT}\right)\right].$$

Further, the state of electrons being not bonded to the surface of the semiconductor is called a dangling bond. In this case, since the energy state of the electrons is positioned in the center of the bandgap, the dark current may significantly increase due to tunneling passing through the energy state of the dangling bond.

This dark current is reduced when the temperature is lowered. However, as the temperature decreases, the occurrence of dark current decreases, but when the temperature is lowered below a certain temperature (e.g., −40° C.), it does not decrease further or may rather increase. This phenomenon occurs because the number of thermally generated electric charges (electron-hole pairs) decreases as the temperature decreases, but the lifetime increases and the probability of entering the SPAD active area increases. Therefore, a need exists for a method for reducing the temperature of the device.

SUMMARY

An embodiment of the present invention aims to provide a single photon detector with photon detection performance enhanced by minimizing the occurrence of dark current.

According to an embodiment, a single photon detector configured to reduce a dark current comprises a buffer layer, a light absorption layer, a grading layer, an electric field control layer, and a window layer sequentially formed on a substrate. An active area may be formed in the window layer. A barrier junction may be formed through the window layer up to at least a portion of the light absorption layer, around the active area.

According to an embodiment, the single photon detector may further comprise an ohmic contact layer formed in one area on the window layer.

According to an embodiment, the single photon detector may further comprise an anode electrode formed directly on the active area or the barrier junction or on an ohmic contact layer formed on the window layer in which the active area or the barrier junction is positioned.

According to an embodiment, the single photon detector may further comprise a cathode electrode formed on the ohmic contact layer positioned a predetermined distance away from the anode electrode or formed under the substrate.

According to an embodiment, the barrier junction is formed a predetermined distance away from the active area.

According to an embodiment, the barrier junction may form an electric field when power is applied to the anode and a cathode electrode formed on the barrier junction.

According to an embodiment, the active area may be formed by implanting or diffusing a first impurity into the window layer.

According to an embodiment, the barrier junction may be formed by implanting or diffusing a second impurity that is the same as or different from the first impurity through the window layer up to at least the portion of the light absorption layer.

According to an embodiment, a single photon detection system configured to reduce a dark current comprises a gate signal generator generating a gate signal, a light receiver including a single photon detector, the light receiver receiving the gate signal from the gate signal generator and outputting an avalanche signal from an introduced photon, and a determination unit receiving the avalanche signal output from the light receiver and determining whether the photon is received. The single photon detector is configured to reduce a dark current and comprises a buffer layer, a light absorption layer, a grading layer, an electric field control layer, and a window layer sequentially formed on a substrate. An active area may be formed in the window layer. A barrier junction may be formed through the window layer up to at least a portion of the light absorption layer, around the active area.

According to embodiments of the disclosure, it is possible to enhance photon detection performance by minimizing occurrence of dark current.

It is also possible to minimize dark count noise by minimizing the occurrence of dark current.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Various changes may be made to the present invention, and the present invention may come with a diversity of embodiments. Some embodiments of the present invention are shown and described in connection with the drawings. However, it should be appreciated that the present disclosure is not limited to the embodiments, and all changes and/or equivalents or replacements thereto also belong to the scope of the present disclosure. Similar reference denotations are used to refer to similar elements throughout the drawings.

The terms "first" and "second" may be used to describe various components, but the components should not be limited by the terms. The terms are used to distinguish one component from another. For example, a first component may be denoted a second component, and vice versa without departing from the scope of the present disclosure. The term "and/or" may denote a combination(s) of a plurality of related items as listed or any of the items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when a component is "directly connected to" or "directly coupled to" another component, no other intervening components may intervene therebetween.

The terms as used herein are provided merely to describe some embodiments thereof, but not to limit the present disclosure. As used herein, the singular forms "a," "an," and "the" are intended to include the plural forms as well, unless the context clearly indicates otherwise. As used herein, the term "comprise," "include," or "have" should be appreciated not to preclude the presence or addability of features, numbers, steps, operations, components, parts, or combinations thereof as set forth herein.

Unless otherwise defined, all terms including technical and scientific terms used herein have the same meaning as commonly understood by one of ordinary skill in the art to which the embodiments of the present disclosure belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The components, processes, steps, or methods according to embodiments of the disclosure may be shared as long as they do not technically conflict with each other.

Figure 1:
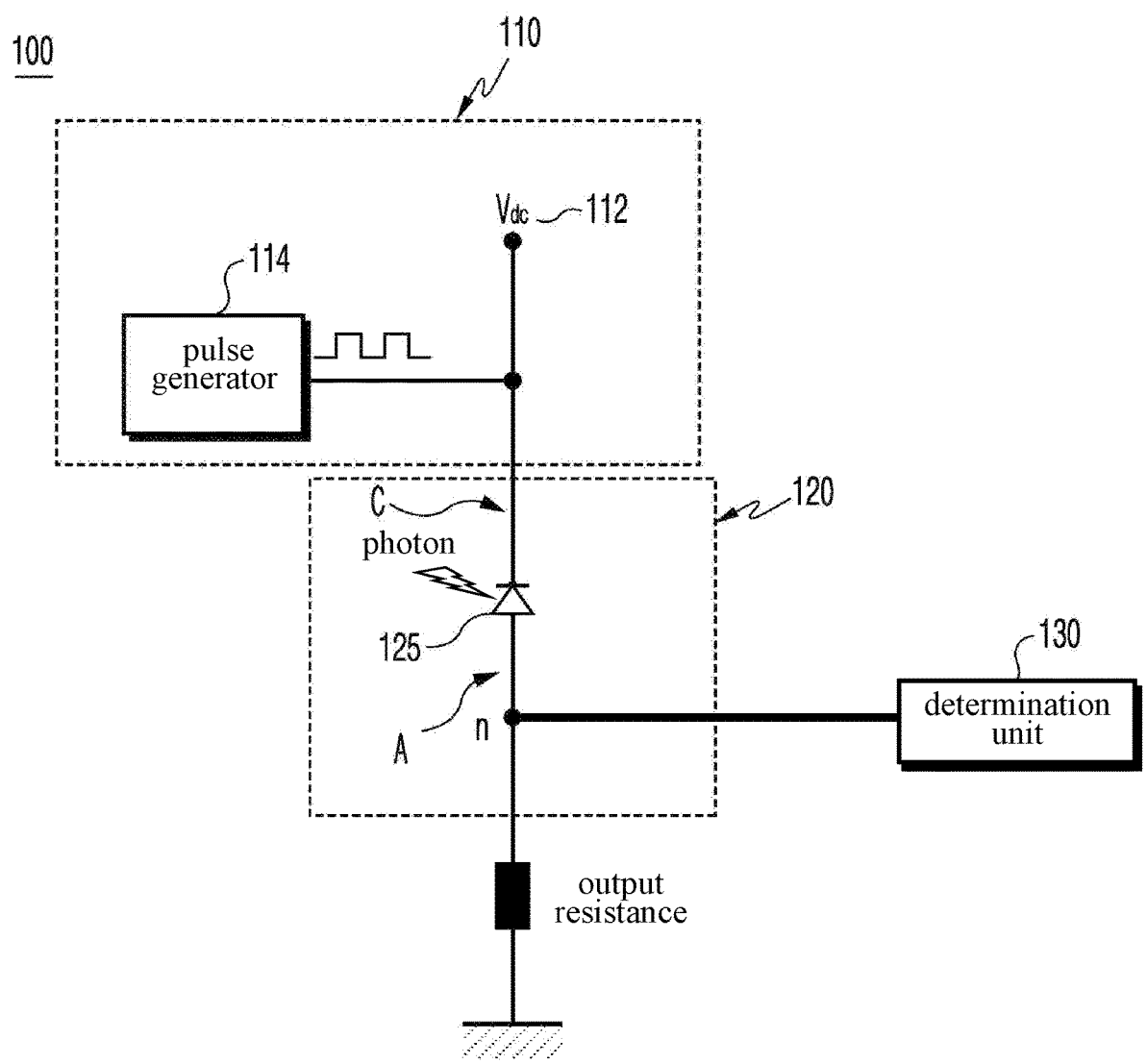
FIG. 1 is a view illustrating a single photon detection system according to an embodiment of the disclosure.

FIG. 1 is a view illustrating a single photon detection system according to an embodiment of the disclosure.

Referring to FIG. 1, according to an embodiment, a single photon detection system 100 includes a gate signal generator 110, a light receiver 120, and a determination unit 130.

The gate signal generator 110 generates a gate signal GS in the form of a pulse PS or a sine wave and applies the gate signal GS to the light receiver 120.

The gate signal generator 110 may include a direct current (DC) voltage source 112 and a pulse generator 114.

The gate signal generator 110 generates the gate signal GS by combining (or mixing or synthesizing) a DC bias voltage Vdc generated by the DC voltage source 112 and a pulse generated by the pulse generator 114.

The gate signal GS is a signal for operating the light receiver 120 in a gated Geiger mode (hereinafter simply referred to as 'Geiger mode') and is input through a cathode terminal C of the light receiver 120 to the single photon detector 125. The gate signal GS is described below in detail with reference to FIG. 2.

Figure 2:
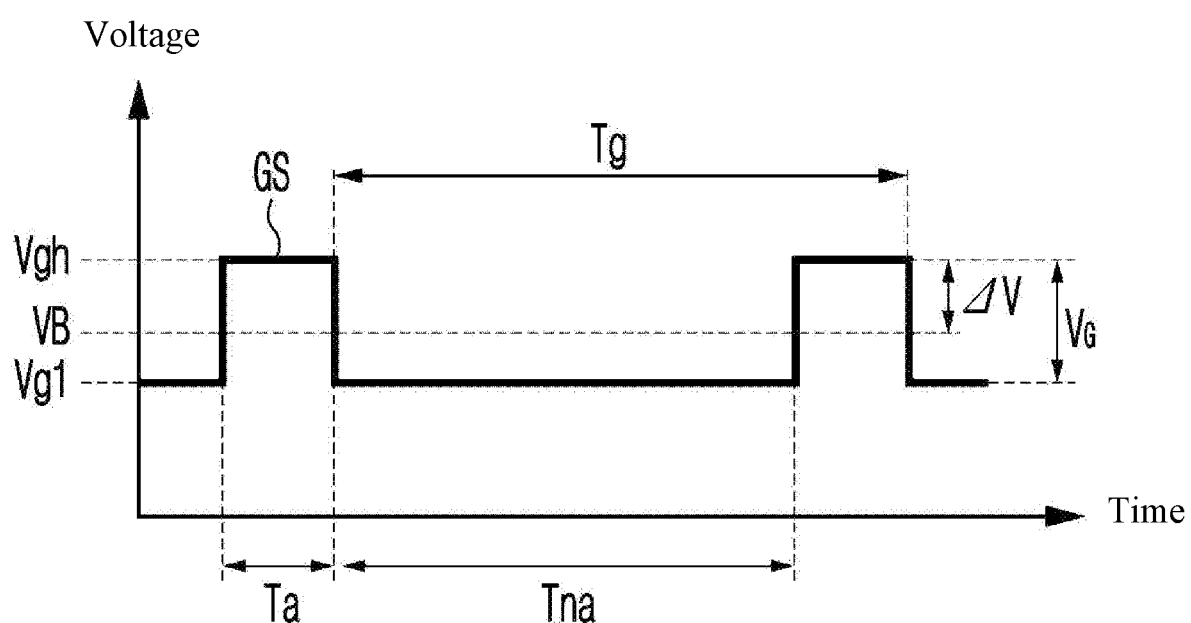
FIG. 2 is a graph illustrating a waveform of a gate signal output from a gate signal generator according to an embodiment of the present invention.

FIG. 2 is a graph illustrating a waveform of a gate signal output from a gate signal generator according to an embodiment of the present invention.

Referring to FIG. 2, in general, the gate signal GS is maintained at a first bias voltage Vg1 during a gate-off (Tna) period and is maintained at a second bias voltage Vgh, which is higher than the first bias voltage Vg1, during a gate-on (Ta) period. Here, the first bias voltage Vg1 may be the same voltage as the bias voltage Vdc generated from the DC voltage source 112.

The amplitude $V_G$ of the gate signal GS is calculated as the difference between the second bias voltage Vgh and the first bias voltage Vg1, and the period Tg of the gate signal GS is a period of time from the point where the gate-on Ta starts to the point where the next gate-on Ta starts. A differential voltage ($\Delta V$, or an absolute value of the differential voltage) between a breakdown voltage VB and the second bias voltage Vgh of the gate signal GS means an over bias voltage. The gate signal GS may have a frequency of several tens of megahertz (MHz) to several gigahertz (GHz).

Referring back to FIG. 1, the gate signal GS is transmitted to the light receiver 120, and the single photon detector 125 is operated in the Geiger mode by the gate signal GS. In this case, a photon is set to be input to the single photon detector 125 in an active period Ta during which the gate signal GS is maintained at the second bias voltage Vgh. Accordingly, as the gate signal GS is applied to the single photon detector 125, the single photon detector 125 operates in the Geiger mode during the active period Ta.

The light receiver 120 receives the pulse (PS)-type gate signal GS generated from the gate signal generator 110 and outputs an avalanche signal Av.

More specifically, the light receiver 120 includes a cathode terminal C, a single photon detector 125, and an anode terminal A.

The cathode terminal C is provided at one end of the single photon detector (e.g., an APD) 125, receives the gate signal GS generated from the gate signal generator 110, and transfers the gate signal GS to the single photon detector 125.

The single photon detector 125 receives the gate signal GS and detects incoming photons. The single photon detector 125 may be implemented as an InGaAs/InP-type avalanche photo diode (APD), but is not limited thereto. The single photon detector 125 receives the gate signal GS from the cathode terminal C and thus operates in the Geiger mode in which photodetection is performed at a reverse bias voltage Vgh greater than the breakdown voltage VB. Here, the Geiger mode refers to a mode or an operation in which the single photon detector 125 performs photodetection at a reverse bias voltage Vgh greater than the breakdown voltage VB. In other words, as the single photon detector 125 is operated in the Geiger mode by the gate signal GS and receives photons from the outside, the avalanche phenomenon (or amplification) in which carriers are amplified inside the single photon detector 125 occurs. More specifically, if the single photon detector 125 is reverse biased by the gate signal GS, a high electric field is created at the PN junction of the single photon detector 125 by the second bias voltage Vgh of the applied gate signal GS. In this case, if carriers generated by absorption of photons are injected into the amplification layer of the single photon detector 125, they undergo continuous avalanche amplification (avalanche impact ionization) and are amplified into current inside the single photon detector 125, i.e., causing avalanche breakdown. Accordingly, the single photon detector 125 outputs the avalanche signal Av.

The anode terminal A is provided at the other end of the single photon detector 125 and transfers the avalanche signal Av generated from the single photon detector 125 to a node n.

In this case, a dark current may be generated in the single photon detector 125 irrespective of the inflow of photons. The single photon detector 125 structurally minimizes the effect of such a dark current, thereby maximally preventing erroneous detection of photons due to the dark current. A detailed structure of the single photon detector 125 is described below with reference to FIG. 3.

The determination unit 130 determines whether a photon is received based on the avalanche signal Av output from the light receiver 120.

Figure 3:
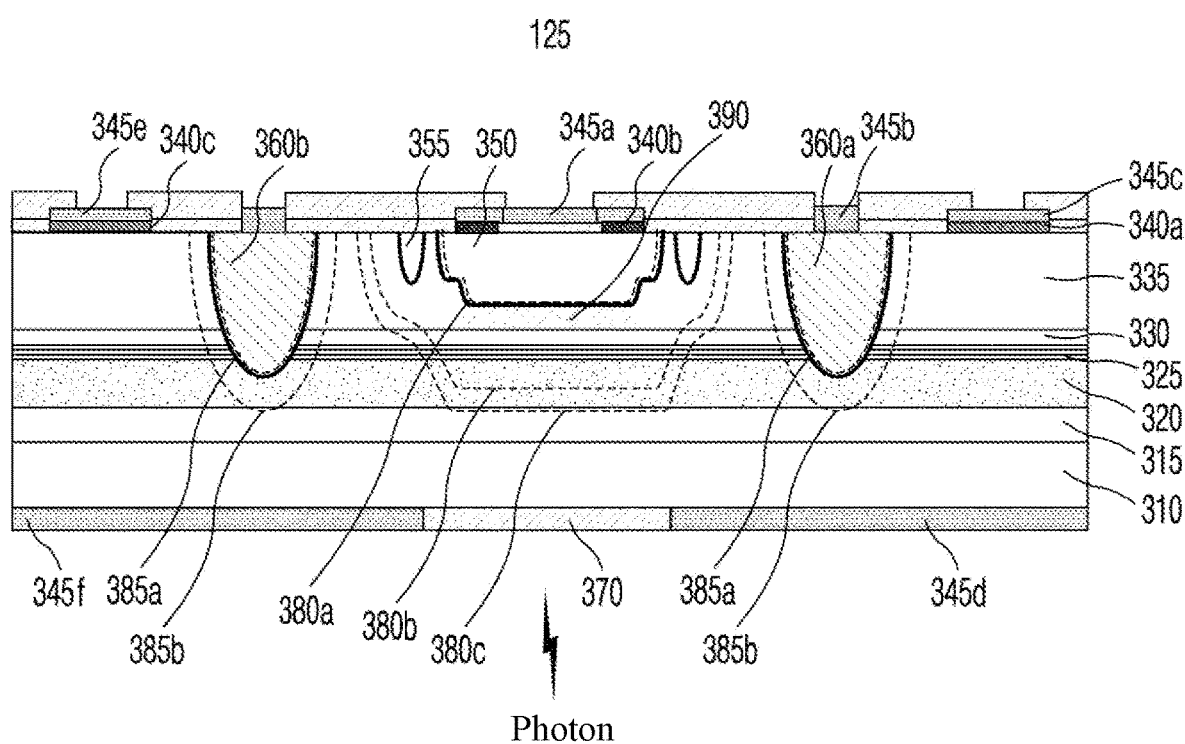
FIG. 3 is a cross-sectional view illustrating a single photon detector according to an embodiment of the disclosure.

FIG. 3 is a cross-sectional view illustrating a single photon detector according to an embodiment of the disclosure.

Referring to FIG. 3, according to an embodiment, a single photon detector 125 includes a p-type active layer (or area) 350 formed by diffusing or implanting p-type impurities into an epitaxial wafer including a substrate 310, a buffer layer 315, a light absorption layer 320, a grading layer 325, an electric field control layer 330, a window layer 335, and an ohmic contact layer 340, a p-type ohmic contact layer 340b, an n-type ohmic contact layer 340a formed in a non-diffusion or non-ion-implantation area, an anode electrode layer 345a formed on the p-type ohmic contact layer and the active layer, a first cathode electrode layer 345c formed on the n-type ohmic contact layer, a guard ring 355 formed by diffusion or ion implantation of p-type impurities into the active area, a barrier junction 360a or 360b formed by diffusion or ion implantation of p-type impurities around the guard ring, a light transmission part 370, and an amplification layer 390.

The active area 350 includes a central portion in which the p-type impurities penetrate deep and a peripheral portion in which the p-type impurities penetrate to a relatively shallow depth. The ohmic contact layers 340a and 340b in the single photon detector 125 may be omitted. The penetration depth of the p-type impurities in the central portion of the active area 350 is in the window layer 335. The penetration depth of the p-type impurities of the barrier junction 360a or 360b may reach through the window layer 335 up to a portion of the light absorption layer 320.

The buffer layer 315 may be stacked on the substrate 310. The substrate 310 may be formed of an n$^+$ InP semiconductor material or a semi-insulating (SI)-InP semiconductor material.

The buffer layer 315 may be stacked on the upper surface of the substrate 310 and perform a lattice matching function. The buffer layer 315 may be formed of an n$^+$ InP semiconductor material.

The light absorption layer 320 may be stacked on the upper surface of the buffer layer 315 and converts photons incident to the light transmission part 370 into carriers. The light absorption layer 320 is formed of n$^-$ InGaAs which has a smaller bandgap than the substrate 310 and the buffer layer 315 and converts the photons incident to the light transmission part 370 and transmitted through the substrate 310 and the buffer layer 315 into carriers.

The grading layer 325 is stacked on the upper surface of the light absorption layer 320 and allows the carriers generated from the light absorption layer 320 to be rapidly transferred to the amplification layer 390 under the active area 350. The grading layer 325 is formed of a material having an intermediate energy bandgap between the energy bandgap of the light absorption layer 320 and the energy bandgap of the electric field control layer 330 so that the carriers generated from the light absorption layer 320 may be quickly transferred to the lower end of the active area 350. Accordingly, the grading layer 325 may be formed of a stack of a plurality of layers formed of n$^-$ InGaAsP. The plurality of n$^-$ InGaAsP layers have different energy bandgaps, and the energy bandgaps may increase from the InGaAs absorption layer to the InP electric field control layer 330.

The electric field control layer 330 may be stacked on the upper surface of the grading layer 325 and controls the electric field of the amplification layer 390 under the active area 350. The electric field control layer 330 may be formed of an n-type InP semiconductor material to control the electric field.

The window layer 335 is stacked on the upper surface of the electric field control layer 330. The window layer 335 is formed of n$^-$ InP. The window layer 335 allows the active areas 350 and barrier junction 360a or 360b to be formed therein or allows the amplification layer 390 to be formed under the active area 350.

The n-type ohmic contact layer 340a is formed around the barrier junction 360a or 360b formed around the guard ring 355 on the upper surface of the window layer, electrically connecting the barrier junction 360a or 360b to the cathode electrode layer 345c.

The n-type ohmic contact layers 340a and 340c are formed on the window layer 335, a predetermined distance away from the active area 350 (e.g., in positions farther from the active area than the barrier junction 360a or 360b). If the cathode electrode layer 345c or 345e is stacked on the n-type ohmic contact layer 340a or 340c, the n-type ohmic contact layer 340a or 340c electrically connect the window layer 335 and the cathode electrode layer.

The p-type ohmic contact layer 340b is formed on the active area 350, which has been converted into the p type in the window layer, electrically connecting the active area 350 with the anode electrode layer 345a.

The p-type ohmic contact layer 340b is formed on the window layer 335 in which the active area 350 is positioned. If the anode electrode layer 345a is stacked on the p-type ohmic contact layer 340b, the p-type ohmic contact layer 340b electrically connects the active area 350 with the anode electrode layer 345a.

A p-type ohmic contact layer (not shown) may also be formed on the top of the barrier junction 360a or 360b, more smoothly connecting the barrier junction 360a or 360b with the anode electrode 345b.

The anode electrode 345a is stacked on the p-type ohmic contact layer 340b or stacked directly on the active area 350, supplying power to the active area 350.

The anode electrode 345b of the barrier junction 360a or 360b is directly stacked on the window layer 335 in which the barrier junction 360a or 360b is formed, supplying power to the barrier junction 360a or 360b. Alternatively, if an ohmic contact layer (not shown) is formed on the upper surface of the window layer in which the barrier junction 360a or 360b is formed, the anode electrode 345b of the barrier junction 360a or 360b is formed on the upper surface of the ohmic contact layer (not shown), supplying power to the barrier junction 360a or 360b.

The cathode electrodes 345c and 345e are stacked on the upper surfaces of the ohmic contact layers 340a and 340c (formed a predetermined distance away from the barrier junction 360a or 360b).

Cathode electrodes 345d and 345f may be additionally formed under the substrate 310.

Although FIG. 3 illustrates that the electrodes 345c to 345f are separated from one another, the electrodes may be integrally formed with each other or connected to one another.

As the electrodes 345a to 345f are formed as described above, power is applied to the active area 350 and the barrier junction 360a or 360b, so that constant equipotential lines 380a, 380b, and 380c and 385a and 385b may be formed.

As power is connected to any one of the anode electrode 345a and the cathode electrodes 345c to 345f, power is supplied to the active area 350. Power is supplied to the active area 350, and different equipotential lines 380a, 380b, and 380c are formed in the active area 350 depending on electric potentials. An electric field is formed in one direction (vertical direction of the equipotential line) according to the potential difference. Since carriers, such as electrons or holes, are injected in the direction in which the electric field is formed, electrons or holes that are thermally generated and contribute to a dark current may be introduced into the active area 350. However, the barrier junction 360a or 360b adjacent to the active area 350 likewise forms equipotential lines 385a and 385b, forming an electric field where carriers may be injected. Accordingly, the barrier junction 360a or 360b may absorb and thus block a significant portion of carriers, e.g., electrons or holes, which would enter the active area 350 if there were no barrier junction 360a or 360b, thereby reducing dark current.

As power is connected to any one of the anode electrode 345a and the cathode electrodes 345c to 345f, power is supplied to the barrier junction 360a or 360b. If power is supplied to the barrier junction 360a or 360b, equipotential lines 385a and 385b that are different depending on electric potentials are formed in the barrier junction 360a or 360b. The equipotential lines 385a and 385b are formed in the barrier junction 360a or 360b, and the barrier junction 360a or 360b mainly attracts the dark current generated in the single photon detector 125. If dark current flows into the amplification layer 390 formed in the active area 350, it may be erroneously detected as a photon, thereby reducing the accuracy of detection. To prevent such a problem, the power source is connected to any one of the electrodes 345c to 345f and the electrode 345b, and the barrier junction 360a or 360b also forms equipotential lines 385a and 385b. Accordingly, the barrier junction 360a or 360b attracts the dark current, preventing the dark current from flowing into the amplification layer 390.

The active area 350 is an area formed by implanting or diffusing a diffusion source into the window layer 335. The implanted or diffused diffusion source may be a p-type impurity, such as Zinc (Zn) and, as the diffusion source is implanted or diffused, the active area 350 has p-type InP characteristics. The active area 350 is formed vertically above the light transmission part 370 through which photons are introduced from the outside into the single photon detector 125. For example, the active area 350 may be positioned to overlap the light transmission part 370. The amplification layer 390 for inducing an avalanche phenomenon may be formed under the active area 350, and the active area 350 transfers an electrical signal caused by the incoming photons to the electrode 345a. To form the amplification layer 390 for inducing the avalanche phenomenon, under the active area 350, the diffusion source into the active area 350 is injected into only a portion of the window layer 335.

If a bias voltage is applied to the anode electrode 345a and either or both of the first cathode electrode 345c and the second cathode electrode 345f, power is supplied to the active area 350. Accordingly, the active area 350 forms equipotential lines 380a, 380b, and 380c according to potentials. Since the equipotential lines 380a, 380b, and 380c form electric fields in the direction perpendicular to the equipotential lines, carriers formed in the direction perpendicular to the equipotential lines by photons are attracted to the amplification layer 390. However, since the equipotential lines 380a, 380b, and 380c are formed in a certain area in the light absorption layer 320, a dark current may be created by carriers thermally generated in the light absorption layer 320, as well as the carriers generated due to the photons, may be attracted to the amplification layer 390 by the equipotential lines 380a, 380b, and 380c. Since the bandgap energy of the light absorption layer is the smallest, the thermally generated dark current mainly occurs in the light absorption layer 320. Since no electric field is applied (there is no equipotential line) to the carriers that are thermally generated around the active area, the thermally generated carriers may move in any direction by receiving a force (F=qE) according to Coulomb's law. If these carriers accidentally enter the active area 350, the carriers are accelerated by the electric field applied to the active area 350 and operate as a dark current. While the size of the active area 350 is very small, the absorption layer area around the active area 350 capable of generating thermal carriers is very wide, so that many carriers may contribute to the dark current. However, if the barrier junction 360a or 360b is formed around the active area 350, the barrier junction 360a or 360b may block thermally generated carriers, which move to the active area 350 from away than the active area 350, thus reducing dark current.

This is described in further detail. The barrier junction 360a or 360b is formed near the active area 350. The barrier junction 360a or 360b is formed by implanting or diffusing a p-type impurity through the window layer 335 up to a portion of the light absorption layer 320. The same p-type impurity as the active area 350 or a different p-type impurity from the active area 350 may be implanted or diffused into the barrier junction 360a or 360b. The barrier junction 360a or 360b is formed near the active area 350, more specifically, a predetermined distance apart from the active area 350. If power is connected to any one of the electrodes 345c to 345f and the electrode 345b, the barrier junction 360a or 360b forms equipotential lines 385a and 385b like the active area 350. The barrier junction 360a or 360b forms equipotential lines 385a and 385b around the active area 350 and attracts a dark current. As described above, since the active area 350 is formed vertically above the light transmitting part 370, carriers caused by photons are attracted to the amplification layer 390 under the active area 350. The dark current mainly generated in the light absorption layer 320 is attracted to the barrier junction 360a or 360b by the equipotential lines 385a and 385b of the barrier junction 360a or 360b formed near the active area 350 as long as the dark current is not the one generated near the active area 350. Accordingly, the barrier junction 360a or 360b may fundamentally block the dark current from being attracted to the amplification layer 390 under the active area 350. Since the size of the active area 350 in the single photon detector 125 is only a few % of the entire size of the single photon detector 125, the barrier junction 360a or 360b may prevent a considerable portion of the dark current by forming the equipotential lines 385a and 385b. A process in which a dark current is induced is illustrated in FIGS. 4 and 5.

Figure 4:
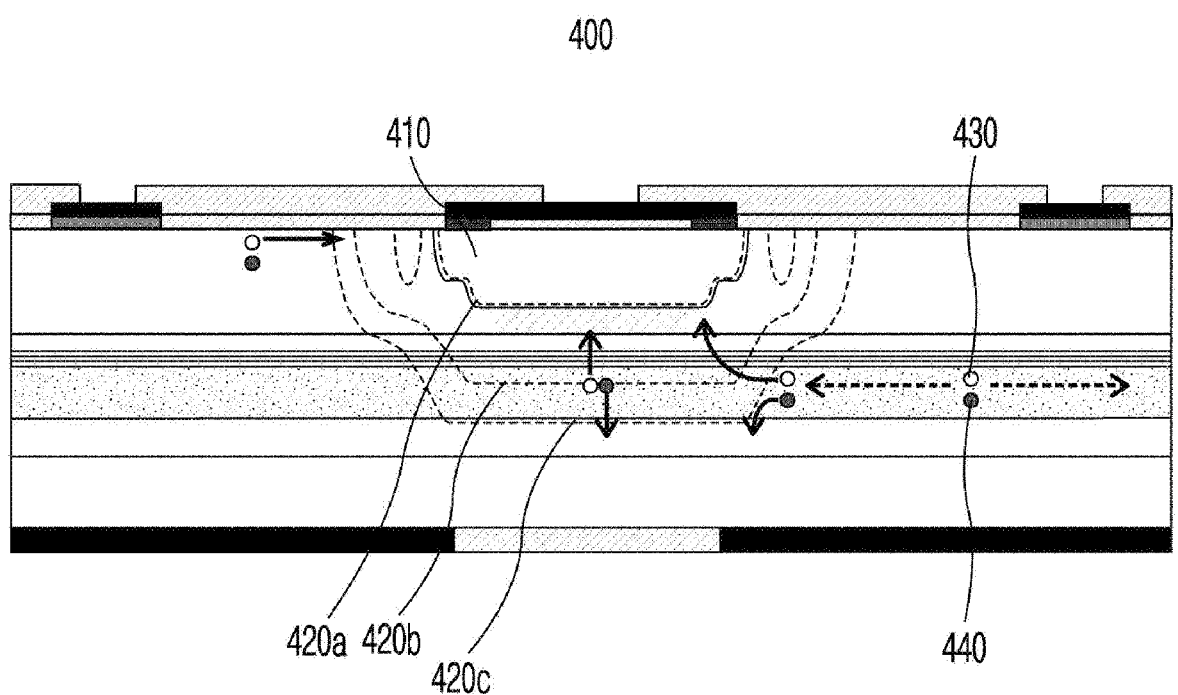
FIG. 4 is a view illustrating a path through which a dark current is generated and moved in a conventional single photon detector.
Figure 5:
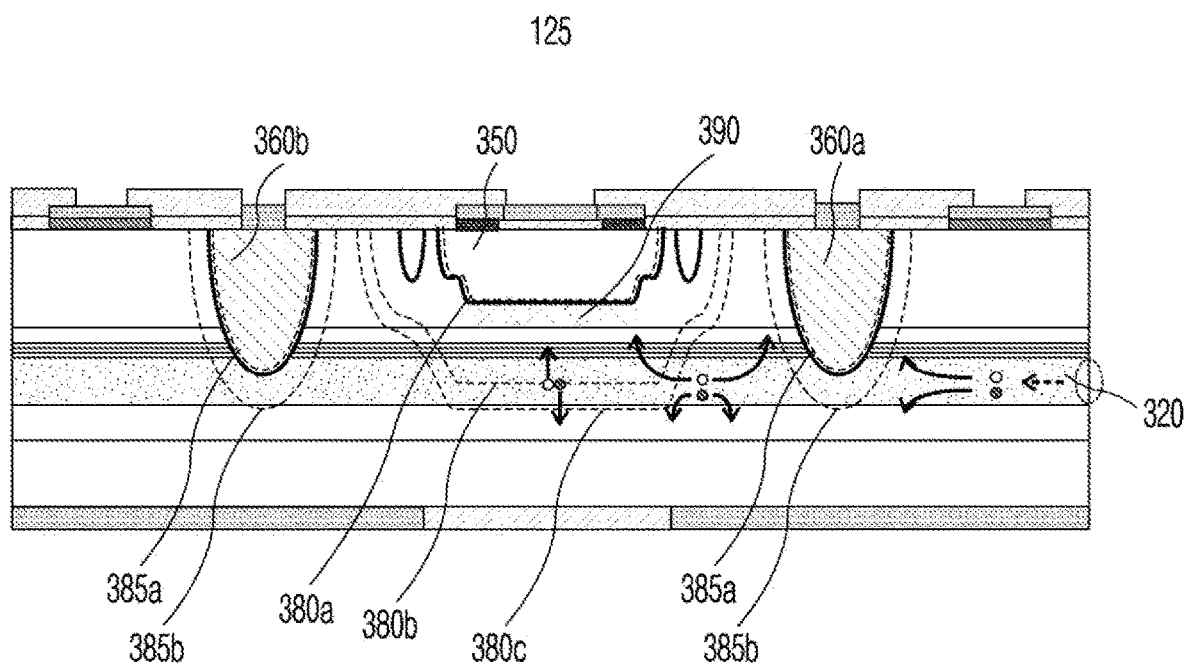
FIG. 5 is a view illustrating a path through which a dark current is generated and moved in a single photon detector according to an embodiment of the present invention.

FIG. 4 is a view illustrating a path through which a dark current is generated and moved in a conventional single photon detector. FIG. 5 is a view illustrating a path through which a dark current is generated and moved in a single photon detector according to an embodiment of the present invention.

The dark current is mainly generated by thermally generated carriers and is mainly generated in the light absorption layer 320 which has small bandgap energy. For example, since the probability of thermal generation of dark current in the window layer is low, it may be neglected. A dark current may occur at any time regardless of application of a gate signal.

Referring to FIG. 4, since the area between the equipotential lines 420a to 420c is the active area where electric fields are applied, the carriers thermally generated inside the active area contribute to dark current. The carriers thermally generated in the light absorption layer 320 far away from the equipotential lines 420 and 425 may travel in a direction different from the direction in which the equipotential lines 420a to 420c are positioned, but the other carriers are mostly attracted to the active area formed by the equipotential lines 420a to 420c. Accordingly, the dark current is amplified and detected through the amplification layer under the active area 410.

Referring to FIG. 5, if a dark current is generated within or very close to the equipotential lines 380a to 380c of the active area 350, the dark current would inevitably be attracted to the amplification layer 390 under the active area 350. However, if a dark current is generated out of the above-described position, the dark current is attracted to the barrier junction 360a or 360b by the equipotential lines 385a and 385b formed by the barrier junction 360a or 360b but is not attracted to the active area 350. Accordingly, it is possible to significantly reduce the false detection rate of photons due to the dark current.

Referring back to FIG. 3, the diffusion source for forming the barrier junction 360a or 360b may be implanted up to the window layer 335 or may be implanted through the window layer 335 and the electric field control layer 330 up to a portion of the light absorption layer 320. To more effectively attract the dark current formed in the light absorption layer 320, the barrier junction 360a or 360b may be formed up to a portion of the light absorption layer 320. Accordingly, even with a small voltage, the barrier junction 360a or 360b may form equipotential lines 385a and 385b and attract dark current accordingly.

The guard ring 355 may be formed in a closed loop or ring shape surrounding the active area 350, reducing the peak of the electric field formed outside the active area 350.

The light transmission part 370 is a portion where no electrode (e.g., the electrode 345a through 345f) is formed under the substrate 310 and allows photons to be incident from the outside thereto. Since a reflection loss of photons may occur due to a difference in refractive index between the air and the semiconductor, the light transmission part 370 may be formed as an anti-reflection film to minimize the reflection loss. The light transmission part 370 may be formed vertically below the active area 350 to allow photons to be incident on the active area 350. The light transmission part 370 may have the same width as the active area 350.

As described above, as the barrier junction 360a or 360b forms equipotential lines, a predetermined distance away from the active area 350, it is possible to effectively attract the dark current. When only a structure for physically blocking carriers flowing from a position near the active area 350 into the active area is included, carriers due to dangling bonds formed on the surface of the semiconductor may be blocked but, as a dangling bond occurs on the surface of the structure, the dark current may increase. However, according to an embodiment, as the barrier junction 360a or 360b forms equipotential lines, it is possible to prevent even a dark current caused by a dangling bond generated on the surface, thereby minimizing the occurrence of a dark current.

Although it is described above in connection with FIG. 3 that each component in the single photon detector 125 is formed of a p-type or n-type material, embodiments of the disclosure are not limited thereto. For example, components described as formed of a p-type material may be formed of an n-type material while components described as formed of an n-type material may be formed of a p-type material.

The above-described embodiments are merely examples, and it will be appreciated by one of ordinary skill in the art various changes may be made thereto without departing from the scope of the present invention. Accordingly, the embodiments set forth herein are provided for illustrative purposes, but not to limit the scope of the present invention, and should be appreciated that the scope of the present invention is not limited by the embodiments. The scope of the present invention should be construed by the following claims, and all technical spirits within equivalents thereof should be interpreted to belong to the scope of the present invention.

What is claimed is:

1. A single photon detector configured to reduce a dark current, comprising:
 a buffer layer, a light absorption layer, a grading layer, an electric field control layer, and a window layer sequentially formed on a substrate, the single photon detector comprising:
 an active area formed in the window layer;

a barrier junction formed a predetermined distance away from the active area by impurity diffusion or ion implantation;
a first anode electrode formed on the active area;
a second anode electrode directly formed on the barrier junction; and
a cathode electrode formed a predetermined distance away from the second anode electrode or formed under the substrate, wherein power is applied to the second anode electrode and the cathode electrode so that the power is supplied to the barrier junction to form an electric field at the barrier junction to allow carriers to be absorbed into the barrier junction,
wherein the barrier junction is formed through the window layer at most up to a portion of the light absorption layer.

2. The single photon detector of claim 1, further comprising
an ohmic contact layer formed in one area on the window layer.

3. The single photon detector of claim 1, wherein the barrier junction is formed around the active area.

4. The single photon detector of claim 1, wherein the active area is formed by implanting or diffusing a first impurity into the window layer.

5. The single photon detector of claim 4, wherein the barrier junction is formed by implanting or diffusing a second impurity that is the same as or different from the first impurity through the window layer up to at least the portion of the light absorption layer.

6. A single photon detection system configured to reduce a dark current, comprising:
a gate signal generator generating a gate signal;
a light receiver including the single photon detector of claim 1, the light receiver receiving the gate signal from the gate signal generator and outputting an avalanche signal from an introduced photon; and
a determination unit receiving the avalanche signal output from the light receiver and determining whether the introduced photon is received.

* * * * *